(12) United States Patent
Ben Jamaa et al.

(10) Patent No.: US 8,937,385 B2
(45) Date of Patent: Jan. 20, 2015

(54) ELECTRONIC COMPONENT AND FABRICATION PROCESS OF THIS ELECTRONIC COMPONENT

(71) Applicant: Commissariat a l'Energie Atomique et aux Energies Alternatives, Paris (FR)

(72) Inventors: Haykel Ben Jamaa, Grenoble (FR); Xavier Baillin, Crolles (FR); Emmanuel Ollier, Grenoble (FR); Ulrich Soupremanien, Grenoble (FR)

(73) Assignee: Commissariat a l'Energie Atomique et aux Energies Alernatives, Paris (FR)

( * ) Notice: Subject to any disclaimer, the term of this patent is extended or adjusted under 35 U.S.C. 154(b) by 0 days.

(21) Appl. No.: 14/098,712

(22) Filed: Dec. 6, 2013

(65) Prior Publication Data
US 2014/0160682 A1 Jun. 12, 2014

(30) Foreign Application Priority Data

Dec. 7, 2012 (FR) .................................... 12 61795

(51) Int. Cl.
*H01L 23/34* (2006.01)
*H05K 7/20* (2006.01)
*H01L 23/427* (2006.01)
(Continued)

(52) U.S. Cl.
CPC ............ *H05K 7/205* (2013.01); *H01L 23/4275* (2013.01); *H05K 13/04* (2013.01); *H01L 23/3121* (2013.01); *H01L 2924/0002* (2013.01)
USPC ............................ 257/714; 257/707; 438/122

(58) Field of Classification Search
USPC ........... 257/706, 707, 712, 713, 714; 438/122
See application file for complete search history.

(56) References Cited

U.S. PATENT DOCUMENTS

| 5,323,292 A * | 6/1994 | Brzezinski ..................... 361/689 |
| 6,097,602 A | 8/2000 | Witchger |
| 6,146,921 A | 11/2000 | Barrow |

(Continued)

FOREIGN PATENT DOCUMENTS

| EP | 1385206 | 1/2004 |
| EP | 1703557 | 9/2006 |

(Continued)

OTHER PUBLICATIONS

Banerjee et al. "On Thermal Effects in Deep Sub-Micron VLSI Interconnects"; ACM pp. 885-891 (1999).
Brunschwiler et al. "Angle-of-Attack investigation of Pin-Fin Arrays in nonuniform heat-removal cavities for interlayer cooled chip stacks" 27th IEEE Semi-Therm Symposium; pp. 116-124 (2011).
Chen et al. "Aligning single-wall carbon nanotubes with an alternating-current electric field" Applied Physics Letters; 78(23):3714-3716 (2001).

(Continued)

*Primary Examiner* — S. V. Clark
(74) *Attorney, Agent, or Firm* — Occhiuti & Rohlicek LLP

(57) ABSTRACT

An electronic component comprising a substrate extending in a plane, having electrical connections to connect the component to a circuit, and having an upper face; an electronic chip arranged on the upper face or inside the substrate and connected to the connections via the substrate, a thick insulating layer forming a package and covering the upper face or at least part of the chip, and having an outer face parallel to the plane; a cavity inside the thick layer, the cavity having a bottom parallel to the plane and a side extending from the bottom to the outer face, the cavity having heat-absorbing material inside that is different from the material forming the thick layer. The heat-absorbing material has a specific heat capacity greater than $1\ kJKg^{-1}K^{-1}$ at a 25° C. and at 100 kPa. Either a bottom or side of the cavity is covered with a interface layer.

14 Claims, 2 Drawing Sheets

(51) Int. Cl.
*H05K 13/04* (2006.01)
*H01L 23/31* (2006.01)

(56) References Cited

U.S. PATENT DOCUMENTS

| | | | |
|---|---|---|---|
| 6,317,321 | B1 | 11/2001 | Fitch et al. |
| 6,535,388 | B1* | 3/2003 | Garcia .......................... 361/704 |
| 2003/0157342 | A1 | 8/2003 | Myers et al. |
| 2007/0290310 | A1 | 12/2007 | Kusano et al. |
| 2008/0137300 | A1* | 6/2008 | Macris et al. ................. 361/699 |
| 2008/0225489 | A1 | 9/2008 | Cai et al. |
| 2011/0103438 | A1* | 5/2011 | Tomita et al. ................. 375/219 |
| 2012/0001319 | A1* | 1/2012 | Brandenburg et al. ....... 257/714 |
| 2012/0049341 | A1* | 3/2012 | Bezama et al. ............... 257/713 |
| 2012/0133039 | A1 | 5/2012 | Pruvost et al. |

FOREIGN PATENT DOCUMENTS

| | | |
|---|---|---|
| FR | 1250240 | 1/2012 |
| FR | 2985603 | 7/2013 |
| WO | WO2013/104620 | 7/2013 |

OTHER PUBLICATIONS

Poupon et al. "3D Integration: a technological toolbox"; IEEE 375-378 (2008).

Subrina et al. "Heat removal in silicon-on-insulator integrated circuits with grapheme lateral heat spreaders" IEEE Electron Device Letters 30(12):1281-1283 (2009).

Szekely et al. "Tracing the Thermal Behavior of ICs"; IEEE Design & Test of Computers 14-21 (1998).

* cited by examiner

ELECTRONIC COMPONENT AND FABRICATION PROCESS OF THIS ELECTRONIC COMPONENT

RELATED APPLICATIONS

Under 35 USC 119, this application claims the benefit of the priority date of French Patent Application 1261795, filed Dec. 7, 2012, the content of which is herein incorporated by reference

FIELD OF DISCLOSURE

The invention relates to an electronic component and to a process for fabricating such a electronic component.

BACKGROUND

The evolution of microelectronic systems over the last few decades has taken the direction of increasing functionality by reducing lithographic dimensions, following Moore's law. For less than a decade, it has been possible to add functionalities to a microelectronic system using the possibilities offered by integration in the vertical dimension, so-called 3D integration. This increase in the density of integration of electronic components in the three available dimensions has had as a direct consequence, namely increased power density that results in generating an increase in the temperature of the transistor junctions, and in the operating temperature of the chip in general.

Known electronic components include a substrate that extends essentially in a plane called the "substrate plane," this substrate being equipped with electrical connections to connect the electronic component to an electronic circuit, this substrate having an upper face, at least one electronic chip arranged on the upper face of the substrate and/or inside the substrate and electrically connected to electrical connections by way of this substrate, and a package mainly formed by a thick layer of electrically insulating material covering an upper face of the substrate and/or at least one part of the electronic chip. The electronic circuit is typically a printed circuit or an integrated circuit.

To cool the electronic chip of such an electronic component, provision has already been made for producing networks of channels inside of which a heat transfer liquid is made to flow. This solution is bulky and consumes power to make the heat transfer liquid flow inside the channels.

To remedy this drawback, passive solutions have been proposed. These passive solutions implement heat-absorbing materials such as PCMs (Phase-Change Materials).

These passive solutions make it possible to absorb heat when the temperature of the electronic chip increases and to release the heat stored by the heat absorber when the temperature of the electronic chip decreases. Passive solutions therefore mainly make it possible to smooth the temperature variations of the electronic chip, but not necessarily to cool it. These passive solutions are well-suited to electronic components intended to be integrated into appliances, such as mobile phones for example, in which the increase of the temperature of the electronic chip is only temporary.

However, integrating a heat-absorbing material into an electronic component is complex, especially as it is often desired to integrate a large amount of heat-absorbing material into the electronic component. It is moreover desirable to improve the effectiveness of the temperature smoothing.

SUMMARY

The fact of placing the cavity inside the thick layer simplifies production of the electronic component because it is no longer necessary to provide an additional layer, typically made of silicon, and inside of which the cavity containing the heat-absorbing material is housed, inside this electronic component.

This is because, whatever the electronic component, the thick layer already exists to protect it from attacks from the outside environment. This thick layer thus performs an additional function, namely the function of sheltering the cavity filled with heat-absorbing material to smooth the temperature variations of the electronic chip.

Moreover, given that the thick layer is generally of considerable thickness, that is to say over 50 or 100 μm in thickness, it is possible to produce one or more cavities inside this thick layer to contain a large volume of heat-absorbing materials. A large volume of heat-absorbing materials increases the effectiveness of the smoothing of the temperature of the electronic chip.

Finally, the presence of a thermal interface layer makes it possible to speed up the diffusion of heat towards the heat-absorbing material, thereby increasing the effectiveness of the smoothing of the temperature of the electronic chip.

The invention allows greater flexibility in the volume and type of absorbing material used and in the size, geometry and location of the cavity or cavities, thereby making it possible to optimize the evacuation of heat more easily, and thus to more effectively flatten the temperature peaks that may be produced by the electronic chip.

These embodiments of the electronic component furthermore have the following advantages:

Maximizing the area of the thermal interface layer by using it to cover the outer surface of the thick layer makes it possible to increase the effectiveness of the evacuation of heat towards the outside of the electronic component and therefore of the cooling of the electronic chip;

When the bottom of the cavity opens directly onto the face of the electronic chip, this increases the effectiveness of the smoothing of the temperature of this electronic chip;

Using a seal coat, to seal the cavity, made of a material with a good thermal conductivity makes it possible to improve the evacuation of the heat from the electronic chip towards the outside and therefore to improve its cooling. This layer is advantageously an attached layer;

When the seal coat makes contact with the thermal interface layer, the evacuation of heat is further promoted;

Using a phase-change material as a heat-absorbing material makes it possible to absorb the heat produced by the electronic chip while maintaining a constant temperature;

Using a thick layer with a Young's modulus strictly below the Young's modulus of the electronic chip makes it possible to improve the resistance of the electronic component to mechanical shock.

These embodiments of the process furthermore have the advantage of a molding step that makes it possible to deposit the thick layer and the cavity in a single operation.

The invention will be better understood on reading the following description, given solely by way of non-limiting example and with reference to the drawings, in which:

BRIEF DESCRIPTION OF THE DRAWINGS

In these figures, the same references are used to denote the same elements.

In the remainder of this description, features and functions that are well known to those skilled in the art are not described in detail.

DETAILED DESCRIPTION

Figure 1:
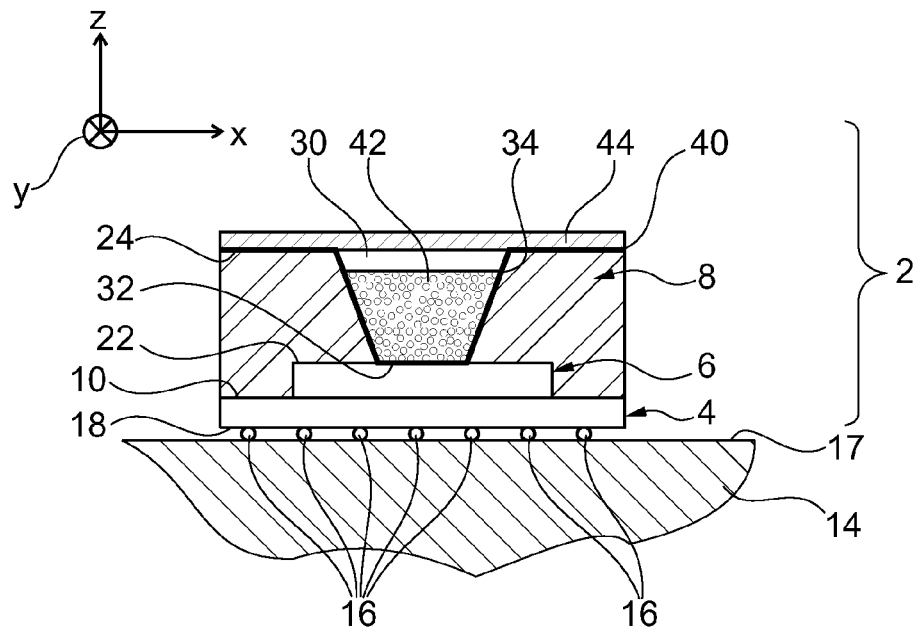
FIG. 1 is a schematic illustration of a vertical section of an electronic component.

FIG. 1 shows an electronic component 2. This component 2 comprises: a substrate 4, at least one electronic chip 6 joined to the substrate 4, and a thick layer 8 covering an upper face 10 of the substrate 4 and a part of the electronic chip 6.

The substrate 4 extends essentially horizontally parallel to a plane called the "substrate plane." The substrate plane lies parallel to orthogonal directions X and Y. The vertical direction in the figures is represented by a direction Z perpendicular to the directions X and Y. Here, the terms "above," "below," "upper" and "lower" are defined with respect to the direction Z.

The substrate 4 makes it possible to electrically connect the chip 6 to an electronic circuit and, for example, to a printed circuit 14, only a part of which is shown in these figures. For this purpose, the substrate 4 comprises electrical connections 16 electrically and mechanically connecting the substrate to electrical tracks produced on an upper face 17 of the printed circuit 14. These electrical tracks on the printed circuit 14 are not shown here.

The electrical connections 16 are, for example, fusible balls situated on a lower face 18 of the substrate 4. The lower face 18 is situated on the opposite side to the face 10. These fusible balls are soldered to corresponding tracks on the printed circuit 14. Such electrical connections are also known by the term "micro-pillars." This assembly of balls is known by the acronym BGA (Ball Grid Array). The balls 16 are for example made of a conducting metal such as copper, mixed with a creep material such as tin.

The substrate 4 also comprises electrical tracks connecting bonding pads of the chip 6 to respective connections 16 of the substrate 4. To simplify FIG. 1, these electrical tracks of the substrate 4 are not shown.

Typically, the substrate 4 is made of a hard material, the hardness of which is for example greater than or equal to that of silicon. Here, the substrate 4 is made of silicon for example. The thickness of the substrate 4 is typically greater than 100 μm or 300 μm.

The chip 6 comprises many active or passive electrical components for performing preset functions. An active electrical component is defined as being an electronic component that makes it possible to increase the power of a signal, for example the voltage or the current or both. Additional power is supplied by a power supply. It is typically a question of components produced from semi-conductors, such as transistors or thyristors. In contrast, a passive electronic component is defined as one that does not increase the power of a signal. It is typically a question of a resistor, a capacitor, an inductor or a coil, or else a diode or any combination of these components. Here, the chip 6, or "die," comprises MOS (Metal Oxide Semiconductor) transistors for example. It includes an active face from which or in which are produced the active or passive components, and a passivated face 22. For example, the face 22 is the back face of the chip. The active face is turned towards the upper face 10. It is mechanically and electrically connected to the upper face 10 of the substrate by electrical connections between pads of the chip 6 and of the face 10. For example, these electrical connections are also produced by means of fusible micro-balls or micro-pillars forming a BGA assembly.

The face 22 of the chip 6 is here made electrically insulating by depositing a passivation layer, not shown.

The thick layer 8 constitutes a major part of the component package 2. It makes it possible to protect the chip 6 and the face 10 of the substrate from mechanical and chemical attack coming from the outside environment of the component 2. For this purpose, it directly covers: the face 10 of the substrate 4 that is not situated under the chip 6, the vertical walls of the chip 6, and in this embodiment, part of the face 22 of the chip 6.

The layer 8 also has a horizontal outer face 24 turned towards the opposite side to the substrate 4. More precisely, the layer 8 protects the chip 6 from moisture and mechanical shocks. For this purpose, where moisture is concerned, the layer 8 passes the seal-tightness test called the "damp heat" test. Such a tightness test is for example defined by a JEDEC standard. This standard notably defines the following test:
1. characterizing the electronic component under standard conditions,
2. placing the electronic component for hundreds of hours, typically over 500 hours, at 85° C. and at a relative humidity of 85%, then
3. characterizing the operation of the electronic component under standard conditions.

If the values measured in steps 1) and 3) above are equal to within a preset margin of error defined by the JEDEC standard, then the layer 8 is said to be seal-tight.

To protect the electronic chip from shocks, the thick layer is made of a material that makes it possible to distribute and reduce mechanical stresses between the chip 6 and the substrate 4. For example, for this purpose, the Young's modulus at 25° C. of the layer 8 is chosen to be strictly below that of the chip 6. For example, the Young's modulus of the chip 6 is substantially equal to the Young's modulus of silicon. The Young's modulus of the layer 8 is then generally chosen to be below 100 GPa or 20 GPa at 25° C.

The layer 8 is also electrically insulating in order to electrically insulate the chip 6 from the outside environment. Here, a layer is considered to be electrically insulating if its conductivity at 25° C. is below $10^{-4}$ S/m and, preferably, below $10^{-7}$ or $10^{-10}$ S/m.

To achieve these results, generally, the layer 8 contains a certain volume of polymer that varies from 5% to 100% of the total volume of the layer 8. The volume of polymer may also be greater than 50% of the total volume. Typically, the polymer is uniformly distributed in the layer 8. It may be an epoxy resin for example.

Moreover, the layer 8 generally has a low thermal conductivity, i.e. a thermal conductivity at 25° C. below 50 $W \cdot m^{-1} \cdot K^{-1}$ and, typically, below 15 $W \cdot m^{-1} \cdot K^{-1}$.

The component package 2 comprises one or more cavities produced in the layer 8 just above the chip 6. To simplify FIG. 1, only one cavity 30 is shown.

The cavity 30 has a horizontal bottom 32 that opens directly onto the face 22 of the chip 6, and a side wall 34 that extends from the bottom 32 to the outer face 24. Here, the side wall 34 is tapered and flares gradually and continuously from the bottom 32 to the outer face 24.

The entrance of the cavity 30 opens onto the outer face 24. The largest width of this entrance is typically greater than 1 μm and can be as large as 1 mm or 2 mm or 5 mm.

The volume of the cavity 30 is greater than 1 nanoliter and, preferably, greater than 10 or 100 μl.

The bottom 32 and the side wall 34 of the cavity 30 are directly covered by a thermal interface layer 40. This layer 40 makes it possible to improve the cooling of the chip 6. For this purpose, the layer 40 is made of a good thermal conductor. Here, the term "good thermal conductor" refers to a material having a thermal conductivity greater than 10 W·m$^{-1}$·K$^{-1}$, and preferably greater than 100 or 200 or 300 W·m$^{-1}$·K$^{-1}$ at 25° C. For example, the layer 40 is made of a metal or an organic material. Here, the layer 40 is made of copper or silver or aluminum.

The thickness of the layer 40 is typically greater than 10 nm and, preferably, greater than 0.1 μm or 50 μm or more.

In this embodiment, the layer 40 also extends over the whole outer face 24.

Most of the cavity 30 is filled with a heat-absorbing material 42. For this purpose, the specific heat capacity at 25° C. and under a pressure of 100 kPa of the material 42 is greater than 1 kJ·Kg$^{-1}$·K$^{-1}$ and, preferably, greater than 1.2 kJ·Kg$^{-1}$·K$^{-1}$.

Here, the material 42 is a phase-change material with a melting point, i.e temperature at which it passes from the solid state to the liquid state, situated in a range of normal operating temperatures of the component 2. For example, the range of operating temperatures of the component 2 is comprised between −90° C. and 250° C. and, generally, between −25° C. and 200° C. Here, the melting point $T_f$ of the material 42 is chosen to lie in the range [0° C.; 200° C.] and, preferably, to lie in the range [100° C.; 200° C.].

The material 42 has a high latent phase change heat, that is to say greater than 100 J/g and, preferably, greater than 200 J/g. This allows the material 42 to absorb a large amount of heat without changing temperature once its melting point is reached. The latent phase change heat is also known by the term phase or state change enthalpy.

For example, the material 42 is chosen from the materials listed in the table below.

| PCM | T(° C.) | J/g | Density (Kg/m$^3$) | KJ/cm$^3$ | Specific heat (J/g·K) | ΔV(%) | Thermal conductivity (W/K·m) | Diffusivity (m$^2$/s) |
|---|---|---|---|---|---|---|---|---|
| Erythriol | 118 | 340 | 1480 | 0.5 | 1.38 | 13.8% | 2.64 | 1.29E−06 |
| PlusICE X180 | 180 | 301 | 1330 | 0.4 | 1.38 | 9.0% | 0.99 | 5.41E−07 |
| A164 | 164 | 306 | 1500 | 0.5 | 1.38 | 10.0% | 0.20 | 9.66E−08 |
| H110 | 110 | 243 | 2145 | 0.5 | 2.41 | 10.0% | 0.45 | 8.70E−08 |

In the above table:
1. the first column contains the name of the phase-change material,
2. the second column contains its melting point,
3. the third column contains its latent phase change heat,
4. the fourth column contains its density,
5. the fifth column contains its volumetric heat capacity,
6. the sixth column contains its heat capacity at 25° C. under a pressure of 100 kPa,
7. the seventh column contains its increase in volume upon passing from the solid state to the liquid state,
8. the eighth column contains its thermal conductivity at 25° C., and
9. the ninth column contains its diffusivity.

The materials PlusICE X180 and A164 and H110 are the commercial reference codes of products sold by PCM Products Ltd.

The volume of the material 42 in the solid state is smaller than its volume in the liquid state. The volume of the material 42 is chosen to fill more than 90%, or 95%, or 99% of the volume of the cavity 30 in the liquid state. Consequently, the volume of the material 42 in the solid state generally fills less than 90% of the total volume of the cavity 30. In FIG. 1, the material 42 is shown in its solid state and an empty space exists inside the cavity to allow for dilation of the material 42 when the latter passes into its liquid state.

To prevent the material 42 from escaping from the cavity 30 when it is in its liquid state, a seal coat 44 completely obstructs the entrance of the cavity 30. This layer 44 extends horizontally to totally cover the entrance of the cavity 30 and the whole periphery of this cavity. Here, the layer 44 covers the whole outer face 24. It is deposited directly on the part of the layer 40 that extends horizontally over the outer face 24.

The layer 44 is made of a good thermal conductor material in order to facilitate cooling of the chip 6 and the dissipation of heat towards the outside. For example, it is made of a metal such as copper or aluminum or of materials such as graphene, graphite, or carbon nanotubes. Its thickness is typically greater than 1 μm or 10 μm and generally less than 1 or 2 millimeters.

The component 2 operates as follows. When the temperature of the chip 6 increases, heat is transmitted to the material 42 by way of the layer 44. The material 42 absorbs the heat and gradually passes into its liquid state. This heat absorption therefore occurs at a constant temperature equal to the melting point of the material 42. At the same time, the layers 40 and 44 dissipate part of the heat produced by the chip 6 towards the outside of the component 2. When the temperature of the chip 6 decreases, the material 42 solidifies. It then releases the heat it had stored to pass into its liquid state. The released heat is diffused and then radiated towards the outside of the component 2 by the layers 40 and 44. Thus the presence of the material 42 in the thick layer 8 makes it possible to attenuate the temporary temperature peaks of the chip 6.

Figure 2:
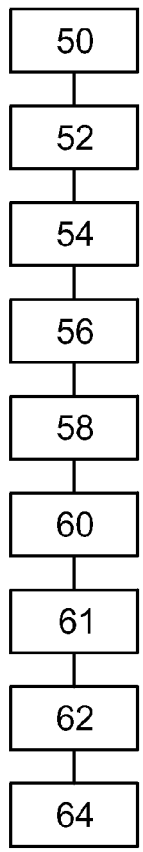
FIGS. 2 and 3 are flowcharts of respective processes for fabricating the electronic component in FIG. 1.

The fabrication of the component 2 will now be described using the process in FIG. 2.

In a step 50, the substrate 4 and the chip 6 joined to the face 10 of the substrate 4, are provided. For example, the chip 6 is joined to the face 10 by way of fusible balls. Here, at this stage, the substrate 4 has already been cut out so that each substrate 4 contains only the one or more electronic chips of a single electronic component.

Several chips 6 and their respective substrates 4 are then placed next to each other with their back faces 22 upwardly displayed.

Step 52 involves a joint deposition or a water-scale deposition of the thick layer 8, which completely covers the face 22 and the parts displayed to the outside of the upper face 10 of the substrate 4. In so doing, a polymer wafer is reconstituted with chips 6 inside. This reconstituted wafer is generally round.

In a step 54, the cavity 30 is produced above each chip 6. For example, the cavity 30 is produced using a mask formed on the outer face 24 and delimiting the locations of each cavity 30. Next, the thick layer 8 is etched only in the locations thus delimited using the face 22 of the chips 6 as a stop layer. This makes it possible to expose part of the face 22 of each chip, at the bottom of each cavity.

In a step 56, the thermal interface layer 40 is deposited. For example, to do this a thin copper film is deposited on the bottom 32, the side wall 34 and on the horizontal outer face 24. The thickness of this thin film is greater than 10 nm or 100 nm and generally less than 1 µm or 5 µm. Next, an additional layer of copper or a mixture of other good thermal conductors is deposited on this thin film by electrolysis to form the layer 40, the thickness of which is greater than 10 or 50 µm.

In an optional step 58, the layer 40 is structured. For example, the layer 40 is structured to free up scribe lines of the reconstituted wafer. This structuring of the layer 40 is for example achieved by photolithography and etching or by irradiation with a laser without photolithography.

In a step 60, the cavity 30 is filled with the material 42 in the liquid state. For example, the material 42 is injected into each of the cavities 30 using a syringe or a nozzle heated to a temperature above its melting point.

Next, in a step 61, the material 42 cools below its melting point and therefore passes into its solid state.

In a step 62, each cavity 30 is sealed with its seal coat 44. For example, each seal coat 44 is fabricated independently of the reconstituted wafer. Here, each layer 44 is a square or rectangular slab with sides over 100 µm or over 1 millimeter in length. Next, the layer 44 is bonded to the outer face 24 to completely obstruct the entrance of the cavity 30. The layer 44 may be bonded using a thin adhesive layer of a thickness below 1 or 5 µm. This bonding may also be performed by direct bonding, i.e. without the addition of adhesive materials if, for example, the layers 40 and 44 are both made of metal. Direct bonding is, for example, obtained by pressing the layer 44 against the layer 40 and by heating to a temperature below the melting point of the material 42.

Finally, in a step 64, the reconstituted wafer is cut up in such a way as to separate each of the electronic components from the other simultaneously fabricated electronic components.

The electronic component 2 shown in FIG. 1 is then obtained.

Figure 3:
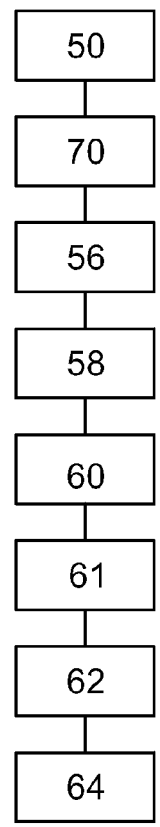

FIG. 3 shows another process for fabricating the component 2. This fabrication process is identical to that in FIG. 2 except that steps 52 and 54 are replaced by a step 70. Step 70 is a step of molding the thick layer 8 on the upper face 10 and on the chips 6. This step 70 is performed using a mold that contains, for each cavity, a relief shape or bump, the shape of which complements the shape of the cavity. Thus, by depositing the layer 8 using this mold, the layer 8 and the cavities 30 are deposited at the same time.

Figure 4:
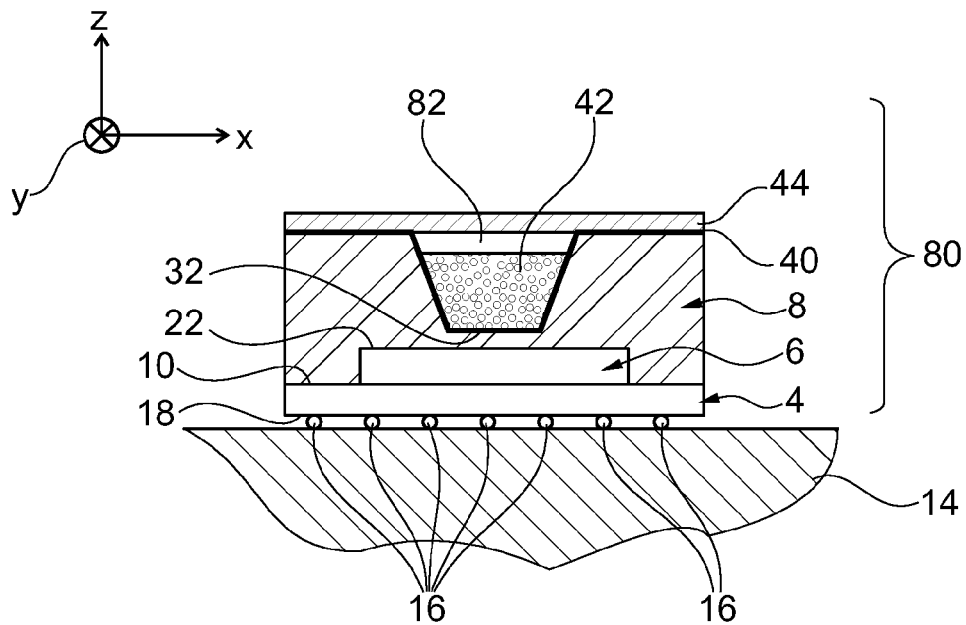
FIGS. 4 and 5 are schematic illustrations of a vertical section of two other embodiments of an electronic component.

FIG. 4 shows an electronic component 80. This component 80 is identical to the component 2, except that the cavity 30 is replaced by a cavity 82. The cavity 82 is identical to the cavity 30 but less deep. Thus, the bottom 32 of the cavity 82 is separated from the face of the chip 6 by a vertical distance of at least 1 µm and typically of less than 200 µm.

Figure 5:
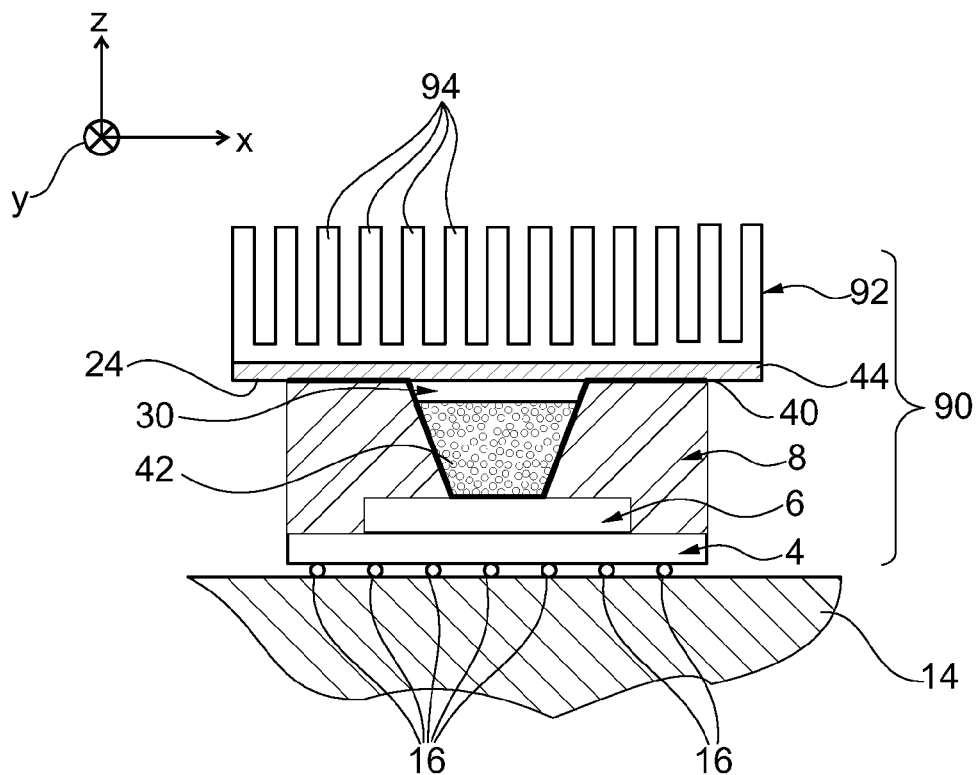

FIG. 5 shows an electronic component 90. This component 90 is identical to the component 2, except that it also comprises a radiator 92 equipped with vertical ribs 94. This radiator 92 is attached directly to the seal coat 44. Here, this coat 44 extends horizontally beyond the outer face 24 to maximize the contact area between this coat 44 and the radiator 92. For example, the radiator 92 is made of a good thermal conductor such as aluminum. The presence of the radiator 92 facilitates and speeds up the cooling of the chip 6.

Many other embodiments are possible. For example, several cavities may be situated above the same face 22 of the same chip 6. Indeed, with respect to mechanical resistance to shock, it may be preferable to produce several small cavities above the chip 6 rather than a single large cavity.

In contrast, the bottom of a given cavity may extend over several back faces of several electronic chips arranged horizontally next to each other.

The seal coat 44 may be made of a metal or of organic materials such as graphene, graphite, or carbon nanotubes.

As a variant, only part of the side wall 34 of the cavity is covered by the thermal interface layer 40. As another variant, the thermal interface layer covers only the bottom of the cavity or only the side wall 34.

Several electronic chips may be stacked vertically on top of each other. In this case, the cavity opens onto the face 22 of the electronic chip that is situated the highest in the stack.

The chip 6 may also be totally or partly embedded into the substrate. For example, when it is totally embedded into the substrate, its face 22 is either located at the same level as the face 10 of the substrate or is buried inside the substrate 4.

The electrical connections between the chip 6 and the substrate or between the substrate 4 and the printed circuit 14 may take other forms. For example, such connections can be provided by electrical pins.

The bottom 32 of the cavity may extend over the whole face of the chip 6. In this case, the layer 8 does not cover the face 22 but only the vertical faces of this chip 6 and part of the upper face 10.

In another embodiment, the active face of the chip 6 extends over the whole of the upper face 10 of the substrate 4. In this case, the layer 8 does not directly cover the upper face 10 but only part of the face 22 of the chip 6.

In the embodiment described here, the face 22 has been described as being the back face of the chip. As a variant, it may be another face, such as the front face, of the chip.

Heat-absorbing materials other than phase-change materials may be used. For example, the heat-absorbing material may be made of a material that can pass reversibly between several different solid states. For example, it may be an elastocaloric material or a shape-memory material that has two crystallographic states in the solid state and that can pass reversibly from one to the other. One of these crystallographic states is generally known by the term "martensitic phase," the other of these solid states being known by the term "austenitic phase."

Other embodiments of the fabrication process are possible. For example, in step 50, it is not necessary for the substrate to have already been cut up. In this case, the substrate 4 comprises electronic chips intended to be integrated into several separate electronic components. Generally, in this case, the substrate 4 takes the form of a circular wafer. For example, the cutting up of the substrate 4 to separate the various simultaneously fabricated electronic chips then takes place in step 64.

Step 54 may also be carried out by irradiating the outer face 24 of the layer 8 only in the location where the cavity 30 must be hollowed out with a laser. The laser causes this layer 8 to melt locally, hollowing out the cavity 30.

The layer 40 may be deposited using other processes. For example, if the layer 40 is made of an organic material, this organic deposit may be deposited in suspension, in a solution containing a volatile solvent, on the bottom 32, on the side wall 34 of the cavity, and on the outer face 24. Next, the volatile solvent evaporates and the layer of organic material settles on the layer 8. The organic material may be graphene, graphite or carbon nanotubes, for example. The layer 40 may also be deposited by roll coating.

The filling of the cavity 30 with the material 42 may also be performed differently. For example, in one practice, the material 42 is spread over the outer face 24 in the liquid state. Next, this outer face 24 is scraped with a blade to eliminate the material 42 situated outside the cavities 30.

It is also possible to proceed in the same way when the material 42 has a pasty texture.

The bonding of the layer 44 may also be performed differently. For example, in an alternative practice, the layer 44 is bonded onto the outer face of the layer 40 using Van Der Waals forces. It is also possible, in step 62, to deposit a layer 44, from a single block of material, that covers all the outer faces of the reconstituted wafer. Next, this layer 44 is cut out in step 64.

Having described the invention, and a preferred embodiment thereof, what is claimed as new, and secured by Letters Patent is:

1. A manufacture comprising an electronic component, said electronic component comprising a substrate that extends in substrate plane, said substrate having electrical connections to connect said electronic component to an electronic circuit, said substrate having an upper face, an electronic chip arranged on said upper face of said substrate and/or inside said substrate, said electronic chip being electrically connected to said electrical connections by way of said substrate, a thick layer forming a package, said thick layer comprising an electrically insulating material covering one of said upper face of said substrate and at least part of said electronic chip, said thick layer having an outer face parallel to said substrate plane, a cavity produced inside said thick layer and situated above said electronic chip in a direction perpendicular to said substrate plane, said cavity having a bottom parallel to said substrate plane and a side wall extending from said bottom as far as said outer face of said thick layer, said cavity being at least partly filled with a heat-absorbing material, said heat-absorbing material being different from a material forming said thick layer, wherein said heat-absorbing material has a specific heat capacity that is greater than 1 kJKg$^{-1}$K$^{-1}$ at a temperature of 25° C. and at a pressure of 100 kPa, and wherein at least one of a bottom of said cavity and a side wall of said cavity is covered with a thermal interface layer.

2. The manufacture of claim 1, wherein at least said bottom of said cavity and said side wall of said cavity are covered by a thermal interface layer, said thermal interface layer being made of a material having a thermal conductivity, at 25° C., of greater than 100 Wm$^{-1}$K$^{-1}$.

3. The manufacture of claim 2, wherein said thermal interface layer also covers part of said outer face of said thick layer.

4. The manufacture of claim 1, wherein said cavity has a bottom parallel to said substrate plane that opens directly onto a face of said electronic chip.

5. The manufacture of claim 1, wherein said electronic component has a seal coat arranged on said outer face of said thick layer, wherein said seal coat completely obstructs an entrance to said cavity to hermetically seal said cavity to said heat-absorbing material, wherein said seal coat has a thermal conductivity, at 25° C., of greater than 100 W·m$^{-1}$·K$^{-1}$.

6. The manufacture of claim 5, wherein said thermal interface layer also covers part of said outer face of said thick layer, and wherein said seal coat makes direct contact with at least part of said thermal interface layer.

7. The manufacture of claim 1, wherein said heat-absorbing material comprises a phase-change material capable of absorbing heat by passing from a solid state to a fluid state, wherein said phase-change material has a latent phase change heat that is greater than 100 J/g, and wherein said phase-change material changes phase between 0° C. and 200° C.

8. The manufacture of claim 1, wherein said thick layer has a Young's modulus that is below a Young's modulus of said electronic chip.

9. The manufacture of claim 1, wherein said thick layer comprises a polymer.

10. A method for fabricating an electronic component, said method comprising providing a substrate that extends along a substrate plane, said substrate comprising electrical connections to connect said electronic component to an electronic circuit, said substrate having an upper face, providing an electronic chip arranged on at least one of said upper face of said substrate and inside said substrate, said electronic chip being electrically connected to said electrical connections by way of said substrate, depositing a thick layer made of an electrically insulating material covering at least one of said upper face of said substrate and at least part of said electronic chip, said thick layer having an outer face parallel to said substrate plane, producing a cavity inside said thick layer, said cavity being situated above said electronic chip in a direction perpendicular to said substrate plane, said cavity having a bottom parallel to said substrate plane and a side wall extending from said bottom as far as said outer face of said thick layer, filling at least part of said cavity with a heat-absorbing material, said heat-absorbing material being different from said material forming said thick layer, and depositing a thermal interface layer at least on one of said bottom of said cavity and on said side wall of said cavity, wherein said heat-absorbing material has a specific heat capacity that is greater than 1 kJ·Kg$^{-1}$·K$^{-1}$ at a temperature of 25° C. and at a pressure of 100 kPa.

11. The method of claim 10, wherein depositing a thick layer and producing said cavity are performed simultaneously by depositing said electrically insulating material that forms said thick layer using a mold containing a relief imprint of said cavity, wherein depositing comprises depositing on at least one of said upper face of said substrate and at least a part of said electronic chip.

12. The method of claim 10, wherein producing said cavity comprises etching said thick layer through a mask.

13. The method of claim 10, wherein producing said cavity comprises irradiating said thick layer using a laser so as to cause said thick layer to melt at a location at which said cavity is to be produced.

14. The method of any one of claim 10, wherein depositing a thermal interface layer comprises depositing said thermal interface layer at least on said bottom of said cavity and on said side wall, wherein said thermal interface layer is made from a material having a thermal conductivity at 25° C. of greater than 100 W·m$^{-1}$·K$^{-1}$.

* * * * *

UNITED STATES PATENT AND TRADEMARK OFFICE
CERTIFICATE OF CORRECTION

PATENT NO.        : 8,937,385 B2
APPLICATION NO.   : 14/098712
DATED             : January 20, 2015
INVENTOR(S)       : Haykel Ben Jamaa et al.

It is certified that error appears in the above-identified patent and that said Letters Patent is hereby corrected as shown below:

Claims

Column 9, line 55-67, claim 5, should read:

-- The manufacture of claim 1, wherein said electronic component has a seal coat arranged on said outer face of said thick layer, wherein said seal coat completely obstructs an entrance to said cavity to hermetically seal said cavity to said heat-absorbing material, wherein said seal coat has a thermal conductivity, at 25°C., of greater than 100 $Wm^{-1}.K^{-1}$. --.

Column 10, line 16-40, claim 10, should read:

-- A method for fabricating an electronic component, said method comprising providing a substrate that extends along a substrate plane, said substrate comprising electrical connections to connect said electronic component to an electronic circuit, said substrate having an upper face, providing an electronic chip arranged on at least one of said upper face of said substrate and inside said substrate, said electronic chip being electrically connected to said electrical connections by way of said substrate, depositing a thick layer made of an electrically insulating material covering at least one of said upper face of said substrate and at least part of said electronic chip, said thick layer having an outer face parallel to said substrate plane, producing a cavity inside said thick layer, said cavity being situated above said electronic chip in a direction perpendicular to said substrate plane, said cavity having a bottom parallel to said substrate plane and a side wall extending from said bottom as far as said outer face of said thick layer, filling at least part of said cavity with a heat-absorbing material, said heat-absorbing material being different from said material forming said thick layer, and depositing a thermal interface layer at least on one of said bottom of said cavity and on said side wall of said cavity, wherein said heat-absorbing material has a specific heat capacity that is 10 greater than 1 $kJ.Kg^{-1}.K^{-1}$ at a temperature of 25 °C. and at a pressure of 100 kPa. --.

Signed and Sealed this
Twenty-seventh Day of October, 2015

Michelle K. Lee
*Director of the United States Patent and Trademark Office*